(12) United States Patent
Kasai et al.

(10) Patent No.: US 6,331,948 B2
(45) Date of Patent: Dec. 18, 2001

(54) ERROR CORRECTING CIRCUIT FOR MAKING EFFICIENT ERROR CORRECTION, AND INVOLATILE SEMICONDUCTOR MEMORY DEVICE INCORPORATING THE SAME ERROR CORRECTING CIRCUIT

(75) Inventors: Takamichi Kasai; Nozomi Kasai, both of Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/732,478

(22) Filed: Dec. 7, 2000

(51) Int. Cl.[7] .................................................. G11C 16/06
(52) U.S. Cl. ...................................................... 365/185.09
(58) Field of Search ......................... 365/185.09, 185.24, 365/185.29

(56) References Cited

U.S. PATENT DOCUMENTS 4,701,884 * 10/1987 Aoki et al. ...................... 365/189.09
5,621,682 * 4/1997 Tanzawa et al. ................ 365/185.09

FOREIGN PATENT DOCUMENTS 10-222995    8/1998   (JP) .

* cited by examiner

Primary Examiner—Trong Phan
(74) Attorney, Agent, or Firm—Gray Cary Ware & Freidenrich LLP

(57) ABSTRACT

This invention provides a nonvolatile semiconductor memory device capable of avoiding complicatedness of algorithm for normal write operation and a write operation prior to erasing in a memory system in which the distribution of threshold of cells after erasing is adjusted. This nonvolatile semiconductor memory device generates check bits as error correction code according to a check bit generating matrix so formed that in both the normal write operation and the write operation prior to erasing, the factors of "1" of respective rows satisfy the quantity absolutely necessary for generating check bits and the quantity of the factors of "1" is an odd number.

12 Claims, 2 Drawing Sheets

FIG.2

ERROR CORRECTING CIRCUIT FOR MAKING EFFICIENT ERROR CORRECTION, AND INVOLATILE SEMICONDUCTOR MEMORY DEVICE INCORPORATING THE SAME ERROR CORRECTING CIRCUIT

CROSS-REFERENCE TO RELATED APPLICATION

This application is based upon and claims the benefit of priority from the prior Japanese Patent Application No. 11-350655, filed Dec. 9, 1999; the entire contents of which are incorporated herein by reference.

BACKGROUND OF THE INVENTION

1. Field of the Invention

The present invention relates to an error correcting circuit for making efficient error correction and a nonvolatile semiconductor memory device incorporating the same error correcting circuit. More particularly, the present invention relates to technology of the nonvolatile semiconductor device incorporating the error correcting circuit for achieving efficient error correction and reduction of power consumption.

2. Background Art

A conventional nonvolatile memory such as a flash memory loaded on a high reliability apparatus has a problem in defective rate (failure rate). To reduce this error rate, a nonvolatile memory having error correcting function has been developed for high reliability applications.

According to an error correction method by this error correcting function disclosed in, for example, Japanese Patent Application Laid-Open No. H5-002898, the error correction is carried out by adding plural redundant bits to information bits to be accessed so as to obtain hamming code. If error correction for 1 bit is carried out with respect to N-bit information bits, X-bit error correction code (that is, check bit) is necessary and the quantity of the check bit is obtained according to $(N+X)+1 \leq 2^x$. For example if error correction of 1 bit is carried out for 32-bit information bits, 6-bit error correction code (check bit) is necessary from the above described equation. An inspection bit generation matrix for generating this check bit is determined by a matrix of 6 rows×32 columns shown in the following equation 1. The check bit (P) is obtained by logical operation shown in the equation 2 based on the check bit generation matrix (A) and 32-bit information bits (D0–D31).

$$A = \begin{bmatrix} a(0,0) & a(0,1) & \cdots & a(0,31) \\ a(1,0) & & & \vdots \\ a(2,0) & & & \vdots \\ a(3,0) & & & \vdots \\ a(4,0) & & & \vdots \\ a(5,0) & \cdots & \cdots & a(5,31) \end{bmatrix} \quad \text{[equation 1]}$$

$$P = A * \begin{bmatrix} D0 \\ \vdots \\ D31 \end{bmatrix} \quad \text{[equation 2]}$$

On the other hand, when detecting an error, a matrix of 6 rows×38 columns (B) shown in the following equation 3 and 32-bit information bits (D0–D31) containing 6-bit check bits (P0–P5) are logically computed as shown in the following equation 4. As a result, a position of the error bit can be specified.

$$B = \begin{bmatrix} a(0,0) & a(0,1) & \cdots & a(0,31) & b(0,32) & \cdots & b(0,37) \\ a(1,0) & & & & \vdots & & \vdots \\ a(2,0) & & & & \vdots & & \vdots \\ a(3,0) & & & & \vdots & & \vdots \\ a(4,0) & & & & \vdots & & \vdots \\ a(5,0) & \cdots & \cdots & a(5,31) & b(5,32) & \cdots & b(5,37) \end{bmatrix} \quad \text{[equation 3]}$$

$$X = B * \begin{bmatrix} D0 \\ \vdots \\ D31 \\ P0 \\ \vdots \\ P5 \end{bmatrix} \quad \text{[equation 4]}$$

The conventional error correcting circuit (hereinafter referred to as "ECC circuit: Error Checking and Correcting Circuit") having such a function comprises a check bit generation circuit for generating a check bit for rewrite data at the time of write, a syndrome calculating circuit for determining presence or absence of an error by the information bit and check bit at the time of readout and a correction circuit for correcting by inverting the information bit if there is found an error.

Next, an access operation of the nonvolatile memory (for example, FLASH EEPROM: Electrically Erasable and Programmable Read Only Memory) for erasing in the unit of plural addresses (block, that is, unit of certain amount of bits) will be described.

First, in the readout operation, 32-bit information bits selected for an address inputted from outside and accompanying 6-bit check bits are accessed at the same time and read out through a readout circuit. A readout result is inputted to the syndrome calculating circuit and the logical operation shown in the previous equation 4 is carried out to detect whether or not there is an error in the read out information bits. If an error is detected in the information bits as a result of the syndrome computation, the information bit is corrected by the correction circuit based on that detection result and outputted.

Second, in a write operation, the 6-bit check bits shown in the previous equation 2 is generated in the check bit generation circuit for 32-bit write data inputted from outside. The write data for an address is 38 bits while 32-bit information bits and 6-bit check bits are held separately.

Third, in an erasing operation, the information bit and check bit are erased at the same time. If each bit value is assumed to be "1" at the time of erasing, all values of the information bits and check bits are "1". If all the information bits are "1" and all the check bits are "1" as a result of reading out respective bits, all bits read out become "1", which means that no error is detected in the syndrome computation.

Although the matrix (B) shown in the previous equation 3 at the time of syndrome computation can be set arbitrarily, conflict may occur in the aforementioned erasing condition. If data is inverted so that all erased data becomes "0" in order to avoid this conflict, the result of syndrome computation becomes "0" even if any matrix is set up, so that the conflict can be avoided.

On the other hand, in some nonvolatile memory such as a flash EEPROM for carrying out intelligent control, write is carried out corresponding to all addresses prior to erasing operation so as to equalize a threshold of cell before erasing and by carrying out the erasing operation after that, a distribution of the thresholds after the erasing is narrowed.

According to this method, in write operation prior to the erasing, it is necessary to write "1" check bit into all "1" information bits and then, "0" check bit into all "0" information bits. Therefore, a check bit generation matrix for generating the "1" check bit for all the "1" information bits and the "0" check bit for all the "0" information bits is necessary.

On the other hand, because, in normal write operation, the check bit generation matrix is set up arbitrarily, the check bits do not become "1" for all the "1" information bits. Therefore, the check bit generation matrix used for the normal write operation cannot be used for a write operation before erasing. Thus, if a system which writes to all addresses prior to the aforementioned erasing is employed, algorithm of erasing operation including the write operation prior to the erasing operation have to be changed in case where such a system is not employed.

On the other hand, in the aforementioned erasing operation, the information bit and check bit are erased at the same time in the nonvolatile memory such as the flash memory EEPROM having an ECC circuit. Thus, current at the time of the erasing operation increases so that power consumption increases. Further, because the information bit and check bit are read out at the same time, current at the time of readout increases so that power consumption increases.

As described above, in the conventional nonvolatile memory having the ECC circuit which employs a system in which the distribution of the threshold is adjusted after the erasing, the same check bit generation matrix cannot be used for the normal write operation and the write operation prior to the erasing. For the reason, there is generated such a problem that the algorithm of the write operation becomes complicated.

Further, because the information bit and check bit are erased and read out at the same time, there is another problem that power consumption increases.

SUMMARY OF THE INVENTION

The present invention has been achieved to solve the above described problems.

An object of the present invention is to provide an error correcting circuit and a nonvolatile semiconductor memory device capable of avoiding complicatedness of algorithm by optimizing a check bit generation matrix and using the same check bit generation matrix for both normal write operation and a write operation prior to erase for adjusting the threshold of cells.

Another object of the present invention is to provide an error correcting circuit and a nonvolatile semiconductor memory device capable of achieving reduction of power consumption.

According to an aspect of the present invention, there is provided a nonvolatile semiconductor memory device for making efficient error correction in a method of adjusting the distribution of threshold of cells after erasing, comprising: an error correction code generating circuit for generating an error correction code necessary for carrying out error correction corresponding to each information data to be inputted, according to check bit generation matrix, the check bit generation matrix being so formed that the factors of "1" in respective rows satisfy the quantity absolutely necessary for generating an error correction code of a necessary bit length and the quantity of the factors of "1" is a odd number; a holding unit in which the information data and error correction code generated by the check bit generating circuit are written and the written information data and the error correction code are held; a write circuit for writing the information data and the error correction code into the holding unit; an erasing circuit for erasing the information data and the error correction code held by the holding unit; a readout circuit for reading out the information data and the error correction code held by the holding unit; a detection circuit for detecting whether or not there is any error in information data read out by the readout circuit based on the error correction code read out by the readout circuit; and a correction circuit for if there is any error in a detection result of the detection circuit, correcting information data having the error.

According to a preferred embodiment, the error correcting code generating circuit is an exclusive-OR gate in which the factors of "1" in respective rows satisfy the quantity absolutely necessary for generating the error correction code of a necessary bit length and the quantity of the factors of "1" is an odd number.

According to another preferred embodiment, the erasing circuit erases the information data and the error correction code held by the holding units separately.

According to still another preferred embodiment, the readout circuit reads out the information data and the error correction code held by the holding units separately.

According to still another preferred embodiment, the holding portion is composed of a flash EEPROM.

According to another aspect of the present invention, there is provided an error correcting circuit for making efficient error correction in a method of adjusting the distribution of threshold of cells after erasing, comprising: an error correction code generating circuit for generating an error correction code necessary for carrying out error correction corresponding to each information data to be inputted, according to check bit generation matrix, the check bit generation matrix being so formed that the factors of "1" in respective rows satisfy the quantity absolutely necessary for generating an error correction code of a necessary bit length and the quantity of the factors of "1" is a odd number; a detection circuit for detecting whether or not there is any error in information data read out from a memory cell based on the error correction code generated; and a correction circuit for if there is any error in a detection result of the detection circuit, correcting information data having the error.

According to still another aspect of the present invention, there is provided a nonvolatile semiconductor memory device for making efficient error correction in a method of adjusting the distribution of threshold of cells after erasing, comprising: an error correction code generating portion for generating an error correction code necessary for carrying out error correction corresponding to each information data to be inputted, according to check bit generation matrix, the check bit generation matrix being so formed that the factors of "1" in respective rows satisfy the quantity absolutely necessary for generating an error correction code of a necessary bit length and the quantity of the factors of "1" is a odd number; a holding portion in which the information data and error correction code generated by the check bit generating circuit are written and the written information data and the error correction code are held; a writing portion for writing the information data and the error correction code into the holding portion; an erasing portion for erasing the information data and the error correction code held by the holding portion; a reading portion for reading out the information data and the error correction code held by the holding portion; a detecting portion for detecting whether or not there is any error in information data read out by the readout circuit based on the error correction code read out by the readout circuit; and a correcting portion for if there is any error in a detection result of the detection circuit, correcting information data having the error.

Various further and more specific objects, features and advantages of the invention will appear from the description given below, taken in conjunction with the accompanying drawings illustrating by way of example a preferred embodiments of the invention.

BRIEF DESCRIPTION OF THE DRAWINGS

Figure 2:
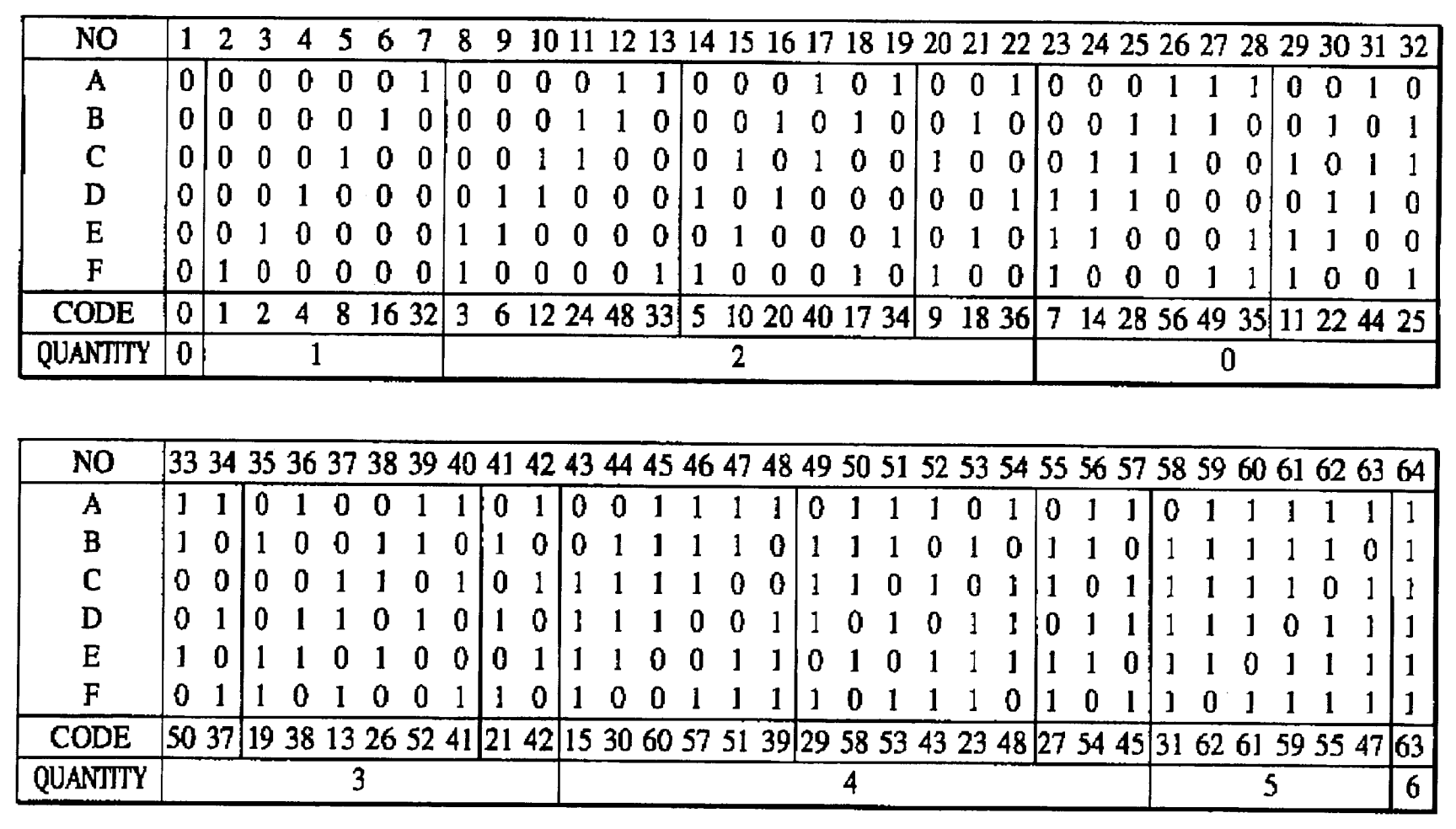

FIG. 2 is a diagram showing an example of check matrix.

DETAILED DESCRIPTION OF THE PREFERRED EMBODIMENTS

Figure 1:
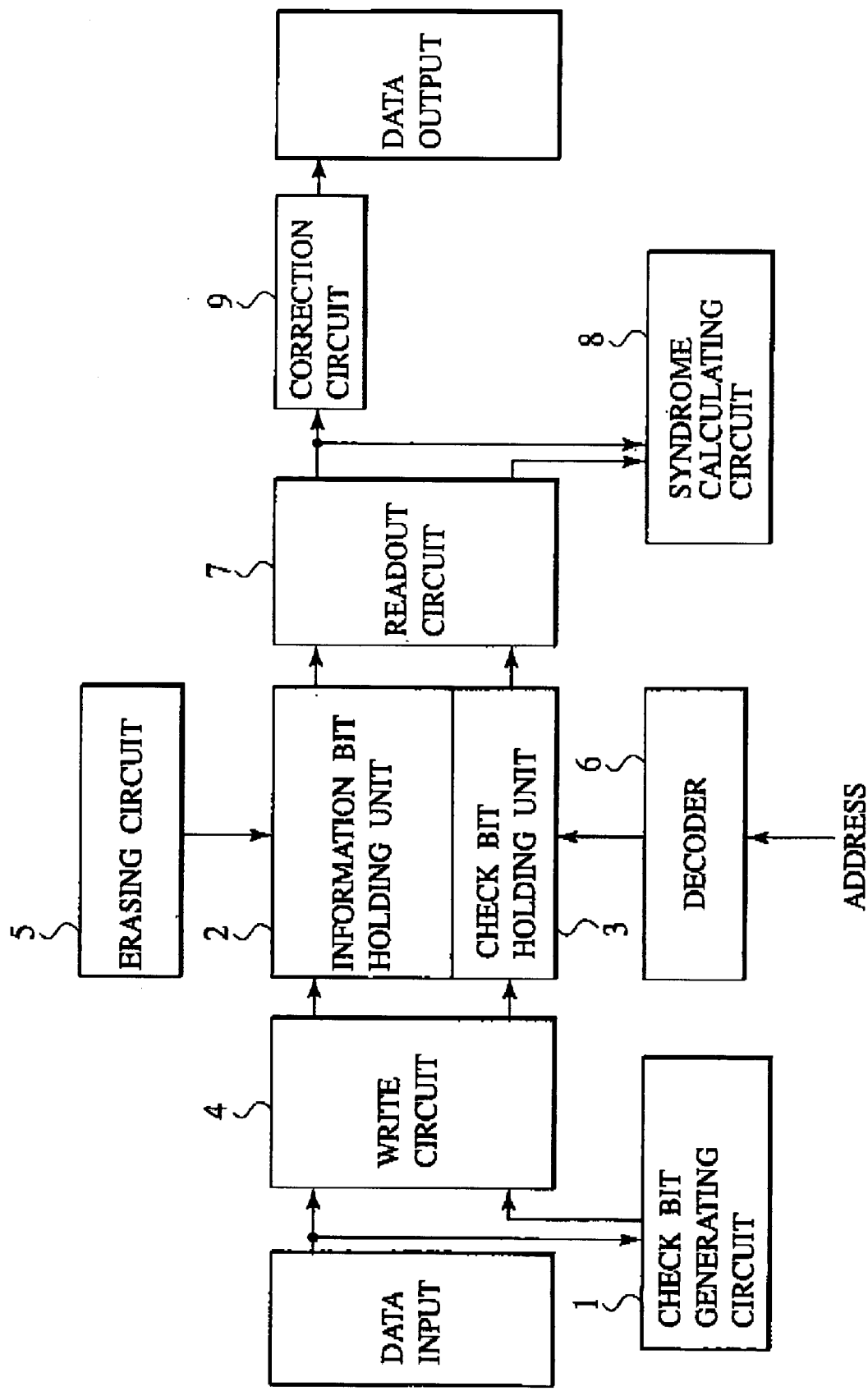
FIG. 1 is a diagram showing a structure of a nonvolatile semiconductor memory device according to an embodiment of the present invention.

Hereinafter, a nonvolatile semiconductor memory device according to an embodiment of the present invention will be described in detail with reference to FIGS. 1, 2.

According to this embodiment, by employing an optimum check bit generation matrix, a function for avoiding complicatedness of algorithm in the write operation is provided.

FIG. 1 is a diagram showing a structure of a nonvolatile semiconductor memory device according to an embodiment of the present invention. In FIG. 1, the nonvolatile semiconductor memory device of this embodiment comprises a check bit generating circuit 1, an information bit holding unit 2, a check bit holding unit 3, a write circuit 4, an erasing circuit 5, a decoder 6, a readout circuit 7, a syndrome calculating circuit 8 and a correction circuit 9.

The check bit generating circuit 1 generates an error correction code (check bit) necessary for carrying out error correction corresponding to each inputted information data (information bit) according to a check bit generation matrix. The check bit generation matrix is comprised of a matrix in which factors "1" of respective rows satisfy a quantity absolutely necessary for generating a check bit while the quantity of "1" is odd.

The information bit holding unit 2 holds information bits which are written. The check bit holding unit 3 holds check bits which are generated in the check bit generating circuit 1 and written.

The write circuit 4 writes information bit and check bit into the holding units 2, 3. The erasing circuit 5 is capable of erasing the information bit and check bit held in the holding units 2, 3, respectively.

The decoder 6 selects the holding units 2, 3 to be accessed by receiving an address.

The readout circuit 7 is capable of reading out the information bit and check bit held in the holding units 2, 3 separately.

The syndrome calculating circuit 8 is a detection circuit for detecting whether or not there is any error in information bit read out from the information bit holding unit 2 by the readout circuit 7 based on the check bit read out from the check bit holding unit 3 by the readout circuit 7.

If there is any error in the information bit as a result of detection by the syndrome calculating circuit 8, the correction circuit 9 corrects information bit having the error.

Hereinafter, an operation of this embodiment will be described by taking a case where 6-bit check bits are generated when 1-bit error is corrected to 32-bit information bits as an example. However, the bit configuration of the present invention is not restricted to the following example.

The check bit generating circuit 1 generates 6-bit check bits (P) according to the previous equation 2 based on the check bit generation matrix (A) shown in the following equation 1 as described above.

$$A = \begin{bmatrix} a(0,0) & a(0,1) & \cdots & a(0,31) \\ a(1,0) & & & \vdots \\ a(2,0) & & & \vdots \\ a(3,0) & & & \vdots \\ a(4,0) & & & \vdots \\ a(5,0) & \cdots & \cdots & a(5,31) \end{bmatrix} \quad \text{[equation 1]}$$

$$P = A * \begin{bmatrix} D0 \\ \vdots \\ D31 \end{bmatrix} \quad \text{[equation 2]}$$

Respective bits P0–P5 of the check bits can be obtained according to a logical operation expression of $\{(0-5, 0) \times D0 + a(0-5, 1) \times D1 + \ldots + a(0-5, 31) \times D31\}$ as shown in the equation 2. Here, the + in the above expression indicates exclusive OR. Therefore, to obtain a solution of the above logical operation, exclusive OR (EX-OR) gate is used.

In order to accelerate operational speed by simplifying the circuit when the EX-OR gate is employed, the quantity of "1" of factor a (0–5, 0–31) of each row of the check bit generation matrix (P) has to be reduced as much as possible, so that entry into the EX-OR gate is reduced. However, in order to generate 6-bit check bits when an error of 1 bit is corrected to 32-bit information bit, the quantity of the above "1" of each row is required to be at least 14. Thus, to ensure 14 "1"s in each row of the check bit generation matrix like conventional technique, by excluding an error absence code (No. 1 of FIG. 2) at the time of error detection and error detection codes (Nos. 2–7 of FIG. 2) of the equation 3, b (0–5, 32–37) from the check matrix shown in, for example, FIG. 2, an arbitrary matrix is selected such that the quantity of "1"s in each row is small and the quantities of "1"s in respective rows are the same (for example, Nos. 8–19, 23–42 of FIG. 2 is selected).

For example, the check bit generation matrix shown in the equation 5 is set up and then, the error detection code (No. 2–7 of FIG. 2) is added to the check bit generation matrix shown in FIG. 5 and the error detection matrix (B) of the previously described equation 3 is set up as shown in the equation 6 so as to detect an error.

$$\begin{bmatrix} P5 \\ P4 \\ P3 \\ P2 \\ P1 \\ P0 \end{bmatrix} = \begin{bmatrix} 000011 & 000101 & 000111 & 001011 & 010011 & 01 \\ 000110 & 001010 & 001110 & 010110 & 100110 & 10 \\ 001100 & 010100 & 011100 & 101100 & 001101 & 01 \\ 011000 & 101000 & 111000 & 011001 & 011010 & 10 \\ 110000 & 010001 & 110001 & 110010 & 110100 & 01 \\ 100001 & 100010 & 100011 & 100101 & 101001 & 10 \end{bmatrix} * \begin{bmatrix} D0 \\ \vdots \\ \vdots \\ \vdots \\ \vdots \\ D31 \end{bmatrix}$$ [equation 5]

$$\begin{bmatrix} A \\ B \\ C \\ D \\ E \\ F \end{bmatrix} = \begin{bmatrix} 000011 & 000101 & 000111 & 001011 & 010011 & 01 & 000001 \\ 000110 & 001010 & 001110 & 010110 & 100110 & 10 & 000010 \\ 001100 & 010100 & 011100 & 101100 & 001101 & 01 & 000100 \\ 011000 & 101000 & 111000 & 011001 & 011010 & 10 & 001000 \\ 110000 & 010001 & 110001 & 110010 & 110100 & 01 & 010000 \\ 100001 & 100010 & 100011 & 100101 & 101001 & 10 & 100000 \end{bmatrix} * \begin{bmatrix} D0 \\ \vdots \\ D31 \\ P0 \\ \vdots \\ P5 \end{bmatrix}$$ [equation 6]

Therefore, in such a case, the check bit generating circuit 1 is comprised of EX-OR gate for 14 inputs, so that the 6-bit check bits are generated.

However, if all inputs to the EX-OR gate for 14 inputs, composing the check bit generating circuit 1 are set to "1", all outputs are "0". Therefore, if the EX-OR gate for the 14 inputs is used as the check bit generating circuit 1 for all the information bits of "1" at the time of write prior to erasing, the 6-bit check bits are set to "0". Therefore, if the check bit generating circuit 1 is composed of the EX-OR gate for the 14 inputs, the check bits of "1" cannot be generated to all information bits of "1". In write prior to erasing, it is impossible to write all the information bit of "1" and all the check bit of "1".

Thus, in the check bit generating circuit 1 of this embodiment, the quantity of "1" in each row of the check bit generation matrix satisfies 14 absolutely necessary for generating the 6-bit check bits when an error of 1 bit is corrected to 32-bit information bits, and is set to 15 (at least 15 or more in odd number) capable of generating all the check bit of "1" for all the information bits of "1". For example, by selecting any matrix from the check matrixes shown in FIG. 2 as described above (selecting No. 8–No. 19, 23–34, 41–48), the check bit generation matrix according to this embodiment is set up as shown in the equation 7, for example.

Next, in the check bit generation matrix set up as shown in equation 7, the check bits (P0–P5) is calculated by logical operation shown in the following equation 8. Further, the error detection code (Nos. 2–7 of FIG. 2) is added to the check bit generation matrix shown in FIG. 7 and then, the error check matrix (B) of the previous equation 3 is set up as shown in the following equation 9 so as to detect an error.

$P5=D4+D5+D9+D11+D15+D16+D17+D20+D22+D23+D25+D28+D29+D30+D31$ $P4=D3+D4+D8+D10+D14+D15+D16+D19+D21+D22+D24+D27+D28+D29+D30$ $P3=D2+D3+D7+D9+D13+D14+D15+D18+D20+D21+D25+D26+D27+D28+D29$ $P2=D1+D2+D6+D8+D12+D13+D14+D19+D20+D23+D24+D26+D27+D28+D31$ $P1=D0+D1+D7+D11+D12+D13+D17+D18+D19+D22+D25+D26+D27+D30+D31$ $P0=D0+D5+D6+D10+D12+D16+D17+D18+D21+D23+D24+D26+D29+D30+D31$ $$\begin{bmatrix} P5 \\ P4 \\ P3 \\ P2 \\ P1 \\ P0 \end{bmatrix} = \begin{bmatrix} 000011 & 000101 & 000111 & 001011 & 01 & 001111 \\ 000110 & 001010 & 001110 & 010110 & 10 & 011110 \\ 001100 & 010100 & 011100 & 101100 & 01 & 111100 \\ 011000 & 101000 & 111000 & 011001 & 10 & 111001 \\ 110000 & 010001 & 110001 & 110010 & 01 & 110011 \\ 100001 & 100010 & 100011 & 100101 & 10 & 100111 \end{bmatrix} * \begin{bmatrix} D0 \\ \vdots \\ \vdots \\ \vdots \\ \vdots \\ D31 \end{bmatrix}$$ [equation 7]

$$\begin{bmatrix} A \\ B \\ C \\ D \\ E \\ F \end{bmatrix} = \begin{bmatrix} 000011 & \vdots & 000101 & \vdots & 000111 & \vdots & 001011 & \vdots & 01 & \vdots & 001111 & \vdots & 000001 \\ 000110 & \vdots & 001010 & \vdots & 001110 & \vdots & 010110 & \vdots & 10 & \vdots & 011110 & \vdots & 000010 \\ 001100 & \vdots & 010100 & \vdots & 011100 & \vdots & 101100 & \vdots & 01 & \vdots & 111100 & \vdots & 000100 \\ 011000 & \vdots & 101000 & \vdots & 111000 & \vdots & 011001 & \vdots & 10 & \vdots & 111001 & \vdots & 001000 \\ 110000 & \vdots & 010001 & \vdots & 110001 & \vdots & 110010 & \vdots & 01 & \vdots & 110011 & \vdots & 010000 \\ 100001 & \vdots & 100010 & \vdots & 100011 & \vdots & 100101 & \vdots & 10 & \vdots & 100111 & \vdots & 100000 \end{bmatrix} * \begin{bmatrix} D0 \\ \vdots \\ D31 \\ P0 \\ \vdots \\ P5 \end{bmatrix} \quad \text{[equation 9]}$$

Here, the + in the above equation indicates exclusive OR. Therefore, a solution of the aforementioned logical operation can be obtained through the exclusive OR (EX-OR) gate for 15 inputs, in which 15 information bits shown in the equation 8 are to be inputted corresponding to each check bit. That is, the check bit generating circuit 1 only has to be composed of the EX-OR gate for 15 inputs. In case where the check bit generating circuit 1 is composed of the EX-OR gate for 15 inputs, if all inputs into the EX-OR gate are made to "1", the output becomes "1" and if all inputs are made to "0", the output becomes "0".

Therefore, when carrying out a write before erasing the information bit holding unit 2 and the check bit holding unit 3 by the erasing circuit 5, if information bits which are all "1" are given to the check bit generating circuit 1 as input data for write, the check bits whose 6 bits are all "1" are generated by the EX-OR gate for 15 inputs which composes the check bit generating circuit 1. The generated check bits which are all "1" and the information bits whose 32 bits are all "1" are written into the information bit holding unit 2 and check bit holding unit 3 through the write circuit 4. Meanwhile, the same operation is enabled when writing "0".

Consequently, the same check bit generation matrix can be used for both the normal write operation and a write operation prior to erasing for adjustment of the threshold of cell, so that complicatedness of algorithm in the write operation can be avoided.

Further, inversion of information bit for loading of the ECC circuit, change of erasing algorithm and the like become unnecessary, so that a peripheral circuit can be formed under the same philosophy as when the conventional ECC circuit is not provided. Further, even before and after the ECC circuit is loaded, the peripheral circuits such as a rewrite sequencer and conversion circuit do not have to be changed. Further, circuits which affect the characteristic such as a write circuit, erasing circuit and readout circuit have the same stress quantity in write and erasing frequencies to a memory cells for holding information bits and check bits. Thus, data before loading the ECC circuit can be used from viewpoints of reliability.

On the other hand, in write/erase tests for the memory cell of the check bit holding unit, all-bit write and erasing do not require setting for test and can be carried out in the same manner as normal operation. Further, test vector before loading with the ECC circuit can be used as it is and comparison with existing data in characteristic evaluation is facilitated.

Because the information bit held by the information bit holding unit 2 and the check bit held by the check bit holding unit 3 are erased separately by the erasing circuit 5, an operating current at the time of erasing is reduces so as to achieve reduction of power consumption. Further, because the information bit held by the information bit holding unit 2 and the check bit held by the check bit holding unit 3 are read out separately by the readout circuit 7, an operating current for readout is reduced so as to achieve reduction of power consumption.

In summary, according to the present invention, the same check bit generation matrix can be used for both normal write operation and a write operation for adjustment of the threshold of cell prior to erasing, so that complicatedness of algorithm of the write operation can be avoided. Consequently, control for write operation and erasing operation becomes equal before and after the ECC circuit is loaded on the nonvolatile semiconductor memory device. Thus, a device before the ECC circuit is loaded can be used. Further, as a circuit accompanied by the information bit and check bit, the same circuit can be used in all write, erasing and readout circuits, so that equalization of the characteristic and reduction of design load can be achieved.

Further, because erase and readout of the information bit and check bit are carried out separately, power consumption can be reduced.

Various modifications will become possible for those skilled in the art after receiving the teachings of the present disclosure without departing from the scope thereof. It is intended, therefore, that all matter contained in the foregoing description and in the drawings shall be interpreted as illustrative only not as limitative of the invention.

What is claimed is:

1. A nonvolatile semiconductor memory device for making efficient error correction in a method of adjusting the distribution of threshold of cells after erasing, comprising:

an error correction code generating circuit for generating an error correction code necessary for carrying out error correction corresponding to each information data to be inputted, according to check bit generation matrix, said check bit generation matrix being so formed that the factors of "1" in respective rows satisfy the quantity absolutely necessary for generating an error correction code of a necessary bit length and the quantity of the factors of "1" is a odd number;

a holding unit in which said information data and error correction code generated by said check bit generating circuit are written and the written information data and the error correction code are held;

a write circuit for writing said information data and said error correction code into said holding unit;

an erasing circuit for erasing said information data and said error correction code held by said holding unit;

a readout circuit for reading out said information data and said error correction code held by said holding unit;

a detection circuit for detecting whether or not there is any error in information data read out by said readout circuit based on said error correction code read out by said readout circuit; and a correction circuit for if there is any error in a detection result of said detection circuit, correcting information data having the error.

2. The nonvolatile semiconductor memory device as claimed in claim 1 wherein said error correcting code generating circuit is an exclusive-OR gate in which the factors of "1" in respective rows satisfy the quantity absolutely necessary for generating the error correction code of a necessary bit length and the quantity of the factors of "1" is an odd number.

3. The nonvolatile semiconductor memory device as claimed in claim 1 wherein said erasing circuit erases said information data and said error correction code held by said holding unit separately.

4. The nonvolatile semiconductor memory device as claimed in claim 1 wherein said readout circuit reads out said information data and said error correction code held by said holding unit separately.

5. The nonvolatile semiconductor memory device as claimed in claim 1 wherein said holding unit is composed of a flash EEPROM.

6. The nonvolatile semiconductor memory device as claimed in claim 1 wherein said holding unit comprises first holding unit in which said error correction code is held and second holding unit in which said information data is held.

7. An error correcting circuit for making efficient error correction in a method of adjusting the distribution of threshold of cells after erasing, comprising:

an error correction code generating circuit for generating an error correction code necessary for carrying out error correction corresponding to each information data to be inputted, according to check bit generation matrix, the check bit generation matrix being so formed that the factors of "1" in respective rows satisfy the quantity absolutely necessary for generating an error correction code of a necessary bit length and the quantity of the factors of "1" is a odd number;

a detection circuit for detecting whether or not there is any error in information data read out from a memory cell based on said error correction code generated; and a correction circuit for if there is any error in a detection result of said detection circuit, correcting information data having the error.

8. A nonvolatile semiconductor memory device for making efficient error correction in a method of adjusting the distribution of threshold of cells after erasing, comprising:

an error correction code generating portion for generating an error correction code necessary for carrying out error correction corresponding to each information data to be inputted, according to check bit generation matrix, said check bit generation matrix being so formed that the factors of "1" in respective rows satisfy the quantity absolutely necessary for generating an error correction code of a necessary bit length and the quantity of the factors of "1" is a odd number;

a holding portion in which said information data and error correction code generated by said check bit generating circuit are written and the written information data and the error correction code are held;

a writing portion for writing said information data and said error correction code into said holding portion;

an erasing portion for erasing said information data and said error correction code held by said holding portion;

a reading portion for reading out said information data and said error correction code held by said holding portion;

a detecting portion for detecting whether or not there is any error in information data read out by said readout circuit based on said error correction code read out by said readout circuit; and a correcting portion for if there is any error in a detection result of said detection circuit, correcting information data having the error.

9. The nonvolatile semiconductor memory device as claimed in claim 8 wherein said error correcting code generating portion is an exclusive OR gate in which the factors of "1" in respective rows satisfy the quantity absolutely necessary for generating the error correction code of a necessary bit length and the quantity of the factors of "1" is an odd number.

10. The nonvolatile semiconductor memory device as claimed in claim 8 wherein said erasing portion erases said information data and said error correction code held by said holding portion separately.

11. The nonvolatile semiconductor memory device as claimed in claim 8 wherein said reading portion reads out said information data and said error correction code held by said holding portion separately.

12. The nonvolatile semiconductor memory device as claimed in claim 8 wherein said holding portion is composed of a flash EEPROM.

* * * * *